United States Patent [19]

van Ommen et al.

[11] Patent Number: 4,514,251

[45] Date of Patent: Apr. 30, 1985

[54] METHOD OF MANUFACTURING A SEMICONDUCTOR DEVICE, IN WHICH PATTERNS ARE FORMED IN A LAYER OF SILICON NITRIDE BY MEANS OF ION IMPLANTATION

[75] Inventors: Alfred H. van Ommen; Henricus G. R. Maas; Johannes A. Appels; Wilhelmus J. M. J. Josquin, all of Eindhoven, Netherlands

[73] Assignee: U.S. Philips Corporation, New York, N.Y.

[21] Appl. No.: 595,092

[22] Filed: Mar. 30, 1984

[30] Foreign Application Priority Data

Apr. 11, 1983 [NL] Netherlands ................ 8301262

[51] Int. Cl.³ .................. B44C 1/22; C03C 15/00; C03C 25/06
[52] U.S. Cl. .................. 156/628; 148/187; 156/643; 156/653; 156/657; 156/662; 156/904
[58] Field of Search ............ 156/628, 653, 657, 662, 156/643, 659.1, 904; 148/1.5, 187; 29/571

[56] References Cited

U.S. PATENT DOCUMENTS 4,108,715 8/1978 Ishikawa et al. ............ 156/662 X

Primary Examiner—William A. Powell
Attorney, Agent, or Firm—Paul R. Miller

[57] ABSTRACT

In a method of manufacturing a semiconductor device, ions are implanted into a layer of silicon nitride over a part of its surface, and the layer is then subjected to an etching treatment. According to the present invention, before the etching treatment takes place, but after the ion implantation, the layer is subjected to a heat treatment in which the implanted part of the layer obtains a higher resistance to etching than the non-implanted part. The heat treatment occurs at temperatures above 750° C. Thus, a negative image of a patterned ion irradiation can be formed in the silicon nitride layer. As a result, the number of cases in which an etching or oxidation mask can be formed in a silicon nitride layer without using additional mask is considerably increased.

17 Claims, 47 Drawing Figures

METHOD OF MANUFACTURING A SEMICONDUCTOR DEVICE, IN WHICH PATTERNS ARE FORMED IN A LAYER OF SILICON NITRIDE BY MEANS OF ION IMPLANTATION

The invention relates to a method of manufacturing a semiconductor device, in which ions are implanted into a layer of silicon nitride over a part of its surface, after which the layer is subjected to an etching treatment.

Such a method is particularly suitable to form in a self-registered manner patterns at desired areas in the layer of silicon nitride without using additional masks of, for example, photolacquer. In a manner usual in silicon technology these patterns can be used as etching masks when etching silicon or silicon oxide or as oxidation masks when locally oxidizing silicon.

From the Japanese Patent Application Kokai No. 53-45974 a method of the kind mentioned in the opening paragraph is known in which boron ions are locally implanted into the silicon nitride layer and in which the etching treatment is carried out in a solution of hydrofluoride. The parts of the silicon nitride layer into which the ions are implanted are more readily soluble than the parts into which no ions are implanted. During the etching treatment, the parts of the silicon nitride layer into which ions are implanted can be removed, whereas parts of the silicon nitride layer into which no ions are implanted are maintained. Thus, a positive image of a patterned ion irradiation is formed in the layer of silicon nitride.

A disadvantage of the known described method is that only positive images of the ion irradiation pattern can be formed in the silicon nitride layer, whereas for a large number of applications just a negative image is desired. This means that it would often be desirable if parts of the silicon nitride layer into which ions are implanted were less readily etchable than parts of the layer into which no ions are implanted.

Experiments have shown that the aforementioned positive effect of the silicon nitride layer on an image-forming ion irradiation applies to all the etchants usual for silicon nitride and does not depend either upon the kind of ions used for the implantation.

The invention has inter alia for its object to provide a method in which parts of the silicon nitride layer into which ions are implanted are less readily etchable than parts of the layer into which no ions are implanted. For this purpose, according to the invention, a method of the kind mentioned in the opening paragraph is characterized in that, after the ion implantation but before the etching treatment, the layer of silicon nitride is subjected to a heat treatment, as a result of which the implanted part of the layer obtains a higher resistance to etching than the non-implanted part of the layer. It is a surprise to find that a heat treatment can cause the aforementioned positive effect of the layer of silicon nitride to be changed to a negative effect.

A preferred embodiment of the method according to the invention is characterized in that ions formed from an element chosen from the group comprising nitrogen, antimony, boron, gallium, phosphorus, arsenic, argon, krypton and xenon are implanted into the silicon nitride layer. By means of ions formed from this group of elements, the resistance to etching of the silicon nitride layer can be influenced so that parts thereof which are not irradiated with ions can be removed with a selectivity sufficiently high for practical applications with respect to parts of the layer which are irradiated with ions. Preferably, the ions are implanted with such an energy that they penetrate at least halfway into the silicon nitride layer, the irradiation doses being chosen above $10^{12}$ ions/cm$^2$. Under these conditions, it can be achieved that non-irradiated parts of the silicon nitride layer can be etched at a rate which is one and a half times higher than that at which the irradiated parts thereof can be etched. A very practical heat treatment is carried out for 10 to 120 minutes at a temperature lying between 750° C. and 1100° C. During such a heat treatment, a substrate on which the silicon nitride layer is disposed can be heated simultaneously without unfavourable consequences so that a very local heating of the silicon nitride layer, for example, by means of laser radiation is not required. Preferably, the silicon nitride layer is deposited at a temperature of 750° C. to 850° C. at a reduced pressure from a gas mixture comprising dichlorosilane and ammonia. The method according to the invention considerably increases the number of cases for which a silicon nitride layer can be used as a layer in which an etching or an oxidation mask can be formed without the use of an additional mask. This will be explained more fully hereinafter.

A first important method according to the invention is for this purpose characterized in that there is formed on the silicon nitride layer a stepped raised portion with a straight edge, which edge is temporarily provided with an auxiliary layer, the ion implantation being carried out with an ion beam which is directed substantially parallel to the edge. The ion implantation can be carried out in the presence of the auxiliary layer on the edge or in the absence of this layer. After the heat treatment, the part of the silicon nitride layer (after removal of the stepped raised portion) which was screened during the ion implantation can be removed, the part of the layer into which ions had been implanted being maintained. Thus, there is formed in the silicon nitride layer a pattern whose position is accurately defined with respect to a processing operation which can be carried out while using the stepped raised portion as a mask, whereby the auxiliary layer is not present or is present on the edge. Relative distances are determined inter alia by the thickness of the auxiliary layer.

A second important method according to the invention of manufacturing an etching or oxidation mask without the use of an additional mask is characterized in that the silicon nitride layer is provided over a stepped raised portion with a straight edge, after which the ion implantation is carried out with an ion beam which is directed substantially parallel to this edge. During the implantation, a part of the silicon nitride layer which is present near the edge of the stepped raised portion is screened by the part of the same layer located on top of the stepped raised portion. After the heat treatment, the part of the silicon nitride layer thus screened can be removed, whereas the part in which the ion implantation has taken place is maintained. Thus, without the use of an additional mask there is formed in the silicon nitride layer a pattern whose position is accurately defined with respect to the stepped raised portion. In this case, the thickness of the silicon nitride layer is one of the factors determining the value of the distance between the edge and the remaining part of the silicon nitride layer extending at right angles to the edge.

A preferred embodiment of the first method is further characterized in that the stepped raised portion with the auxiliary layer is used as a mask during implantation of ions into a substrate located below the silicon nitride layer without the use of the auxiliary layer as a mask during the implantation of ions into the silicon nitride layer. In this manner, it is ensured that ions implanted into the substrate are located below the remaining silicon nitride layer. By etching, there can now be formed in the silicon nitride layer a hole which exposes a part of the substrate which is located at a certain distance from the implanted part thereof.

Another preferred embodiment of the first method is further characterized in that the stepped raised portion with the auxiliary layer is used as a mask for the implantation of ions into the silicon nitride layer without the use of the auxiliary layer as mask during the etching treatment of the silicon nitride layer. In this manner, there can be etched into the silicon nitride layer a gap having a width substantially equal to the thickness of the auxiliary layer. Thus, details in the submicron range can be realized.

A preferred embodiment of the second method is further characterized in that the remaining part of the silicon nitride layer is used as a mask during an oxidation treatment of the exposed edge of the stepped raised portion. In this manner, the edge of the stepped raised portion can be provided with an insulating layer which very closely joins a substrate located below the stepped raised portion. This is due to the fact that a certain distance is obtained between the edge of the stepped raised portion and the remaining part of the silicon nitride layer extending at right angles to the edge as a result of the etching treatment.

Another preferred embodiment of the second method is further characterized in that the remaining part of the silicon nitride layer in conjunction with the exposed edge of the stepped raised portion is used as a mask for an etching treatment of a following layer present below the nitride layer. The distance between the edge of the stepped raised portion and the part of the silicon nitride layer extending at right angles to the edge is used in this case to define the width of a groove to be etched into the following layer. This width can be substantially equal to the thickness of the silicon nitride layer so that in this manner details in the submicron range can be realized.

The invention will now be described more fully, by way of example, with reference to drawings. In the drawings:

FIGS. 1 to 3 show diagrammatically and in cross-sectional view successive stages of the manufacture of a semiconductor device obtained by means of a method in accordance with the invention, FIG. 4 shows the ratio of the etching rates of silicon nitride layers into which no ions are implanted and ions are implanted, respectively, as a function of the temperature of a heat treatment carried out after implantation, but before the etching treatment, FIGS. 5 to 10 show diagrammatically and in cross-sectional view a semiconductor device at successive stages of its manufacture by means of a preferred embodiment of a first method in accordance with the invention, FIGS. 11 to 15 show diagrammatically and in cross-sectional view a semiconductor device at successive stages of the manufacture by means of a variation of the method shown in FIGS. 5 to 10.

The Figures are purely schematic and not drawn to scale. Corresponding parts are generally designated by the same reference numerals.

Figure 1:
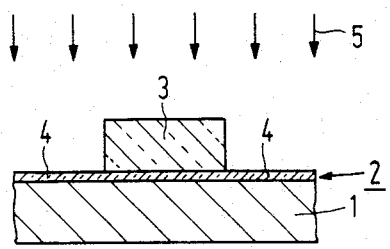
Figure 2:
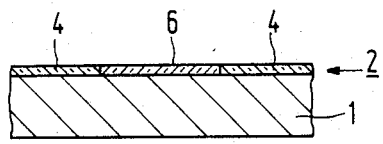
Figure 3:
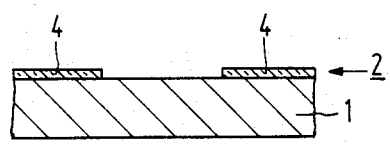

FIGS. 1 to 3 show diagrammatically and in cross-sectional view successive stages of the manufacture of a semiconductor device obtained by means of a method in accordance with the invention. The starting material is a substrate 1 on which a layer 2 of silicon nitride is formed. Ions are implanted into this layer 2 over a part 4 of its surface, which in this case is defined by a photo-lacquer mask 3, as is indicated diagrammatically by arrows 5. According to the invention, the layer 2 of silicon nitride is then subjected to a heat treatment, as a result of which the implanted part 4 of the layer 2 obtains a higher resistance to etching than the non-implanted part 6 thereof. The layer 2 is then subjected to an etching treatment. Since the parts 4 of the silicon nitride layer 2 irradiated with ions are less readily etchable than the parts 6 thereof which are not irradiated with ions, a negative image can be formed of a patterned ion irradiation, as is shown diagrammatically in FIG. 3.

Figure 4:
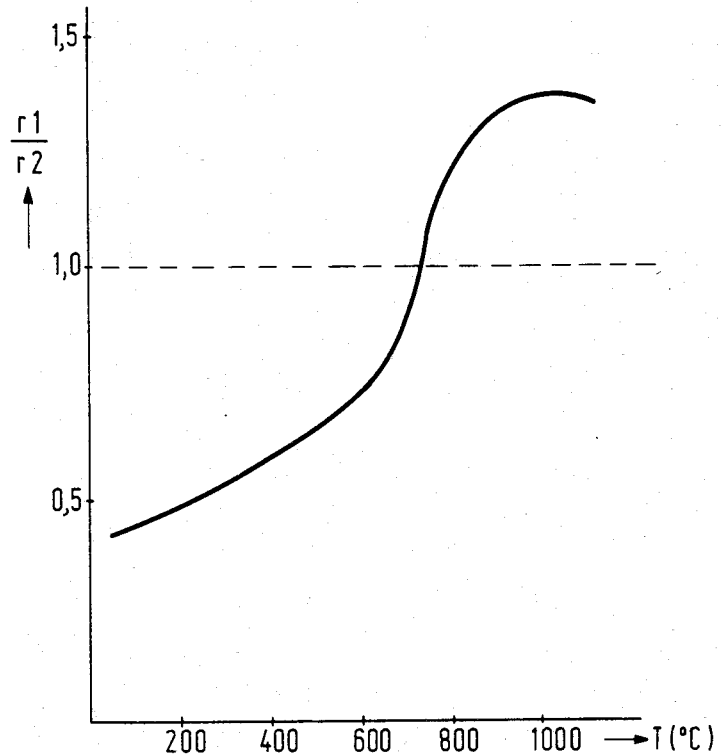
Figure 5:
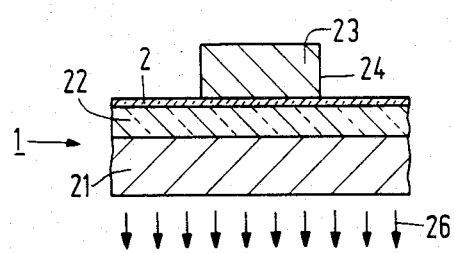

FIG. 4 shows the ratio $r_1/r_2$ of the etching rates of silicon nitride layers into which no ions are implanted and ions are implanted, respectively, as a function of the temperature of a heat treatment carried out after implantation, but before the etching treatment. It has been found that without a heat treatment silicon nitride into which ions are implanted, as is also stated in the Japanese published Patent Application Kokai No. 53-45974, is indeed more rapidly etchable than silicon nitride into which no ions are implanted. This amount does not change due to heat treatments at temperatures up to 750° C. Surprisingly, heat treatments at temperatures above 750° C. result in silicon nitride into which ions are implanted becoming less rapidly etchable than silicon nitride into which no ions are implanted. In this example, silicon nitride was grown on a silicon substrate at a temperature of 820° C. and at a pressure of 10 Pa from a gas mixture of dichlorosilane and ammonia. In this example, arsenic ions were implanted with an energy of 200 keV and a dose of $10^{14}$ ions/cm$^2$. The layer was etched in an aqueous solution containing approximately 4% by volume of hydrofluoride.

Similar results were attained if ions formed from an element chosen from the group comprising nitrogen, antimony, boron, gallium, phosphorus, argon, krypton and xenon were implanted into a silicon nitride layer grown in the same manner. Preferably, the ions are implanted with such an energy that they penetrate at least halfway into the silicon nitride layer, which means that an energy of 25 to 250 keV has to be used. The doses then should amount to $10^{12}$ to $10^{15}$ ions/cm$^2$. In this manner, the ratio of etching rates $r_1/r_2$ can be 1.5. As a heat treatment to be carried out before the etching treatment, heating to 750° C. to 1100° C. for 15 to 120 minutes has proved satisfactory. The silicon nitride layer is preferably deposited at a temperature of 750° to 850° C. and at a reduced pressure from a gas mixture comprising dichlorosilane and ammonia.

The ratio $r_1/r_2$ of the etching rates at which the non-implanted and implanted silicon nitride layers, respectively, can be etched after the heat treatment in accordance with the invention depends upon the etchant used. In an aqueous solution containing 50% by volume of hydrofluoride, $r_1/r_2$ is at most 1.5, while in an aqueous solution containing 0.3 to 5% by volume of hydrofluoride this ratio is 1.35 and in an aqueous solution containing 85% by volume of phosphoric acid 1.1. In the second case $r_1 = 5.5$ nm/min and $r_2 = 4$ nm/min after a heat treatment at 1000° C. In a plasma produced in a gas mixture comprising carbon tetrafluoride (CF$_4$) and a few % by volume of oxygen, $r_1/r_2$ is at most 1.3.

With methods in accordance with the invention, the usability of silicon nitride layers has increased, as will be explained below.

Figure 10:
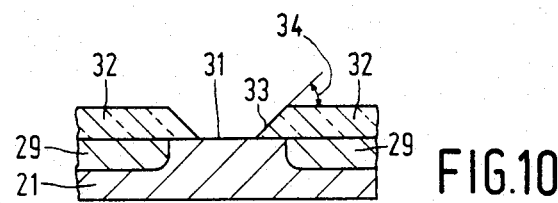
Figure 11:
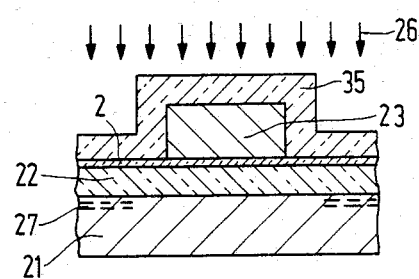
Figure 12:
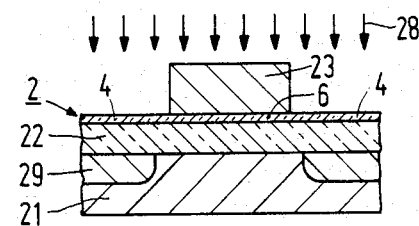
Figure 13:
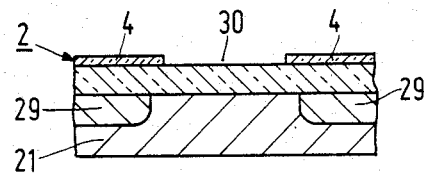
Figure 14:
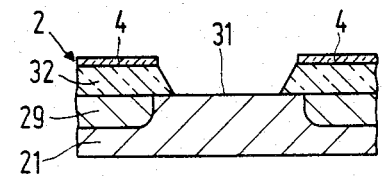
Figure 15:
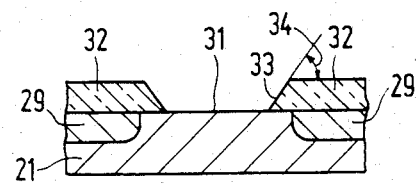
Figure 16:
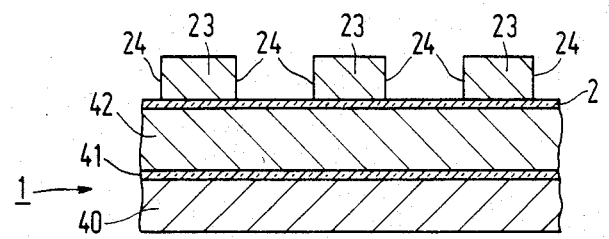
FIGS. 16 to 21 show diagrammatically and in cross-sectional view a semiconductor device at successive stages of the manufacture by means of another preferred embodiment of the first method in accordance with the invention.
Figure 17:
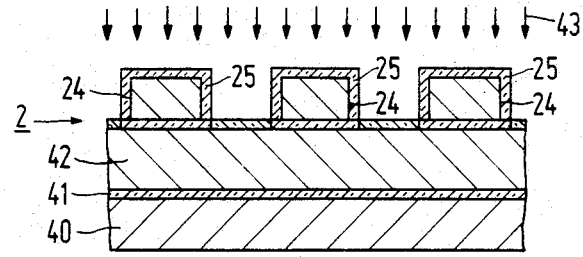
Figure 18:
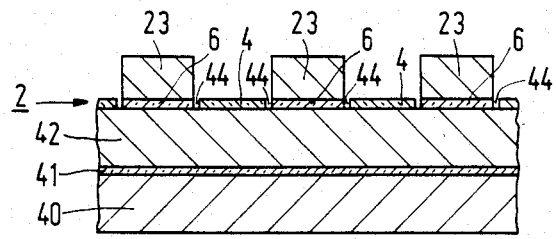
Figure 19:
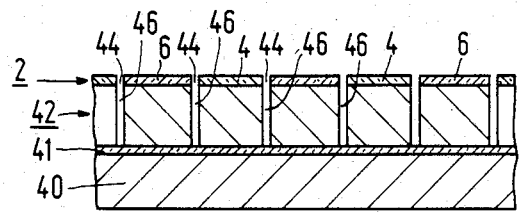
Figure 20:
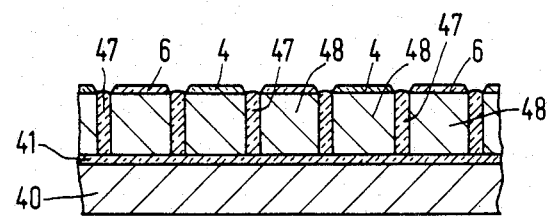
Figure 21:
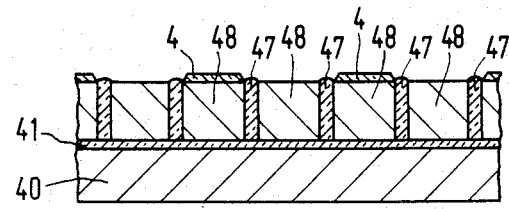
Figure 22:
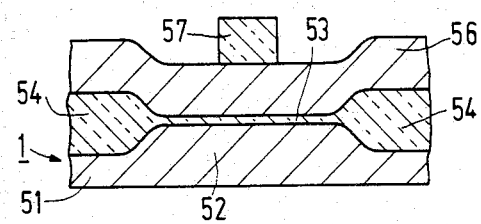
FIGS. 22 to 27 show diagrammatically and in cross-sectional view a semiconductor device at successive stages of the manufacture by means of a preferred embodiment of a second method in accordance with the invention.
Figure 23:
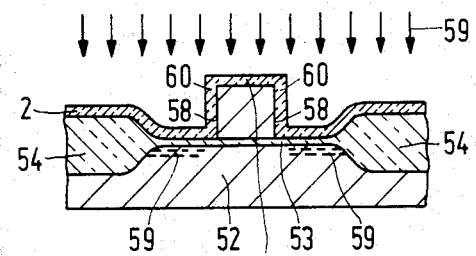
Figure 24:
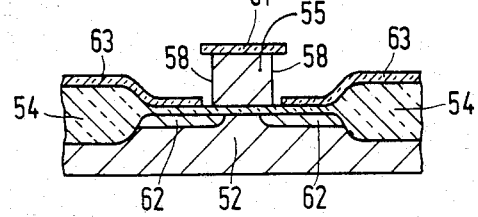
Figure 25:
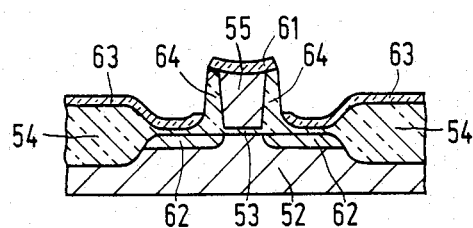
Figure 26:
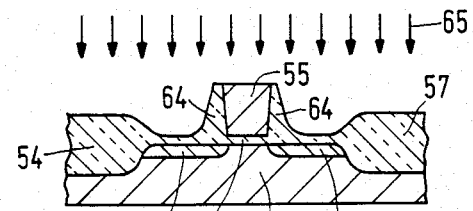

FIGS. 5 to 10 show diagrammatically and in cross-sectional view successive stages in the manufacture of a semiconductor device using a first important embodiment of the method according to the invention. In this embodiment, the invention is used to laterally insulate a surface region 31 of a semiconductor body 21 by means of oxide regions 32 below which doped semiconductor zones 29 are present (FIG. 10).

Figure 6:
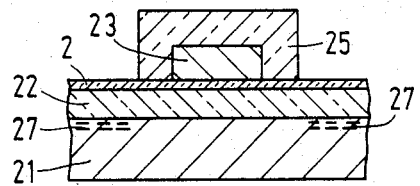
Figure 7:
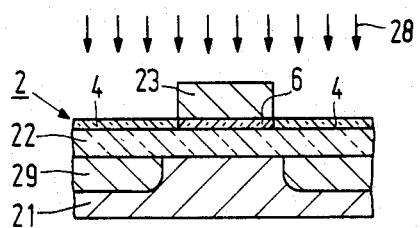
Figure 8:
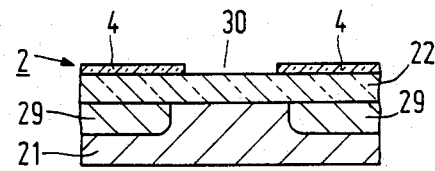
Figure 9:
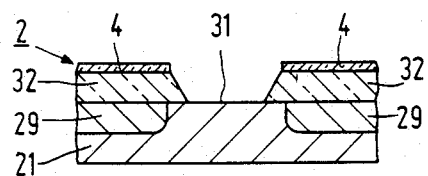

The starting material is a substrate 1 which comprises a semiconductor body 21 of silicon with an approximately 500 nm thick top layer 22 of silicon oxide. The top layer 22 is provided with an approximately 30 nm thick layer of silicon nitride 2 on which is then formed by means of by an photolacquer mask and a usual anisotropic etching treatment a stepped raised portion 23, in this case of polycrystalline silicon, having a height of approximately 1000 nm. This stepped raised portion 23 has straight edges 24 which are temporarily provided with an auxiliary layer 25 (FIG. 6). The ion implantation is carried out, as will be explained below, with a beam of ions which is directed substantially parallel to the edges 24. The ion implantation can be carried out in the presence of the auxiliary layer 25 on the edges 24 or in the absence of this auxiliary layer. After the heat treatment, the part 6 of the silicon nitride layer 2 (FIG. 7), which was screened during the ion implantation, can be removed, whereas the part 4 of the layer 2, into which the ions had been implanted, is maintained. Thus, there is formed in the layer 2 a pattern whose position is accurately defined with respect to another processing operation which is carried out in the presence or in the absence of the auxiliary layer 25 on the edge 24.

In the embodiment shown in FIGS. 5 to 10, the stepped raised portion 23 provided with the auxiliary layer 25 is used as a mask during an ion implantation indicated diagrammatically by arrows 26, with an ion beam of, for example, boron ions 27 into the semiconductor body 21 located below the silicon nitride layer 2, which ion beam is directed substantially parallel to the edges 24. After the auxiliary layer 25 has been removed by means of a usual etching treatment, in which the silicon nitride layer 2 acts as a protective layer for the silicon oxide layer 22, ions are implanted into the silicon nitride layer 2 with the aid of an ion beam indicated by arrows 28 and directed substantially parallel to the edges 24. After the heat treatment in accordance with the invention, the parts 4 of the silicon nitride layer 2, into which the ions are implanted, are less readily etchable than the parts 6 of the layer 2 into which no ions are implanted, while at the same time semiconductor zones 29 are formed by diffusion of the ions 27. An opening 30 can now be etched into the silicon nitride layer 2 with the aid of an aqueous solution of hydrofluoride, the position of this opening being accurately defined with respect to the semiconductor zones 29. Relative distances are determined inter alia by the thickness of the auxiliary layer 25.

The parts 4 of the silicon nitride layer 2 are finally used to remove the part of the silicon oxide layer 22 located below the opening 30 by means of, for example, a solution of hydrofluoride (the etching process for providing the opening 30 and the layer 22 is effected in one step). Since the silicon nitride layer is dissolved also in such an etchant especially at the areas at which it is under-etched, a profile is obtained in the silicon oxide layer 22, such as etched in FIGS. 9 and 10. The part 31 of the semiconductor body 21 thus exposed is laterally insulated by means of oxide regions 32, of which the zones 29 are present. Finally, the remaining parts 4 of the silicon nitride layer 2 are removed. If ions are implanted into the silicon oxide layer 22, this layer becomes more rapidly etchable even after an etching treatment. When the ion implantation 28 is carried out so that ions also reach the layer 22, an oblique edge 33 is obtained at an angle 34 to the surface 31. The angle 34 can be influenced by the ion implantation 28.

FIGS. 11 to 15 show diagrammatically and in cross-sectional view successive stages of the manufacture of a similar semiconductor device which is obtained in a slightly different manner. The stepped raised portion 23 is covered in this case by an auxiliary layer 35 by depositing it, for example, at a low pressure from suitably chosen gases. The remaining manufacturing steps are effected in the same manner as in the embodiment described above. The advantage of this method is that the stepped raised portion can be made of photolacquer, as a result of which a few processing steps can be omitted as compared with the preceding method.

FIGS. 16 to 21 show diagrammatically and in cross-sectional view successive stages of the manufacture of a semiconductor device with the use of a method comparable with the first method of the preceding embodiment. Also in this case, there is formed on the silicon nitride layer 2 a stepped raised portion 23 with straight edges 24 which are temporarily provided with an auxiliary layer 25, while the ion implantation is carried out with an ion beam 43 directed substantially parallel to the edges 24. In this case, a number of closely adjacent mutually insulated conductors 48 are formed in a layer 42 of polycrystalline silicon.

The starting material is a substrate 1 which comprises a semiconductor body 40 of silicon with an approximately 50 nm thick top layer 41 of silicon oxide. On this top layer is disposed a 500 nm thick layer 42 of polycrystalline silicon and on the latter is disposed an approximately 150 nm thick silicon nitride layer 2. On this silicon nitride layer 2 stepped raised portions 23 are then formed by means of a usual photolacquer mask and a usual anisotropic etching process. The stepped raised portions 23, in this case of polycrystalline silicon, have a height of approximately 1000 nm. The stepped raised portions 23 have straight edges 24 which are temporarily provided with an approximately 100 nm thick auxiliary layer 25, for example, by thermally oxidizing the raised portion 23. The stepped raised portion 23 with the auxiliary layer 25 is used as a mask for the implantation of ions into the silicon nitride layer 2. The ion beam, indicated diagrammatically by arrows 43, is directed substantially parallel to the edges 24. The auxiliary layer 25 is then removed and the silicon nitride layer 2 is subjected to the heat treatment in accordance with the present invention. The stepped raised portion 23 freed from the auxiliary layer 25 is now used as a mask during the etching treatment of the silicon nitride layer 2. During this etching treatment, the exposed parts of the silicon nitride layer 2 into which no ions are implanted are removed, whereby openings 44 are formed in the layer 2. These openings 44 have a width which is substantially equal to the thickness of the auxiliary layer 25.

After removal of the stepped raised portions 23, gaps 46 are now etched into the layer 42 of polycrystalline silicon down to the silicon oxide layer 41 with the aid of an anisotropic plasma etching process while using the mask (4, 6, 44) formed in the silicon nitride layer 2. If then the polycrystalline silicon of the layer 42 is subjected to a thermal oxidation treatment, the gaps 46 are filled with the oxide layer 47. Thus, there are formed in the layer 42 of polycrystalline silicon a number of closely adjacent conductors 48 which are mutually insulated by the oxide layers 47. Finally, the parts 6 of the silicon nitride layer 2 can be removed, whereas the parts 4 thereof are maintained so that the conductors 48 are alternately exposed for further contacting.

FIGS. 22 to 27 show diagrammatically and in cross-sectional view successive stages of the manufacture of a semiconductor device with the use of a second important embodiment of the method according to the invention. In this embodiment, the invention is used to manufacture a field effect transistor.

The starting material is a substrate 1 which comprises a semiconductor body 51 of silicon having a surface part 52 which is provided with an approximately 30 nm thick layer of silicon oxide 53 and is surrounded by an approximately 300 nm thick border 54 of silicon oxide serving to laterally insulate the surface region 52. Such a border 54 of oxide is sometimes designated as field oxide. A stepped raised portion 55 is formed on the silicon oxide layer 53 by providing the layer 53 with an approximately 500 nm thick layer 56 of polycrystalline silicon, after which parts not covered by a mask 57 are removed by means of a usual anisotropic plasma etching treatment. A layer of silicon nitride 2 is formed on the stepped raised portion 55, which has straight edges 58. Subsequently, ion implantation is carried out with an ion beam indicated by arrows 59 and directed substantially parallel to the edges 58. During the implantation, which is also utilized to implant ions 59 into the surface region 52, parts 60 of the silicon nitride layer 2, which are present near the edges 58 of the stepped raised portion 55, are screened by the part 61 of the same layer 2 which is located on top of the stepped raised portion 55. After the heat treatment in accordance with the invention, semiconductor zones 62 are formed by diffusion and the part 60 thus screened can be removed, whereas the parts 61, 63 into which the ion implantation has been effected, are maintained. Thus, there is formed in the silicon nitride layer 2 a pattern which leaves free only the edges 58 of the stepped raised portion 55. The thickness of the silicon nitride layer 2 also determines the distance between the edge 58 and the part 63 of the layer 2 of silicon nitride extending at right angles to the edge 58.

The remaining parts 61, 63 of the silicon nitride layer 2 are used as a mask during an oxidation treatment of the exposed edges 58 of the stepped raised portion 55, which is thus provided with an insulating layer 64. Since there is a certain distance between the edge 58 and the parts 63 of the silicon nitride layer, the insulating layer 64 perfectly joins the insulating layer 53 of silicon oxide after the oxidation treatment.

Subsequently, the remaining parts of the silicon nitride layer are removed and the semiconductor zones 62 are more strongly doped near the borders 54 by means of an ion implantation indicated by arrows 65 and a subsequent heat treatment. After contact holes 66 and a metal layer 67 have been provided in a usual manner, the transistor has formed.

Figure 28:
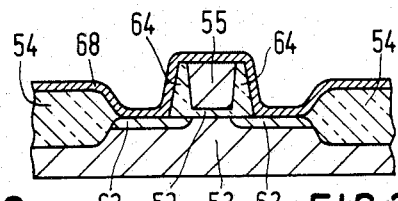
FIGS. 28 to 29 show diagrammatically and in cross-sectional view a semiconductor device at successive stages of the manufacture by means of a variation of the method shown in FIGS. 22 to 27.
Figure 29:
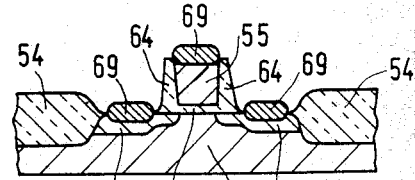
Figure 30:
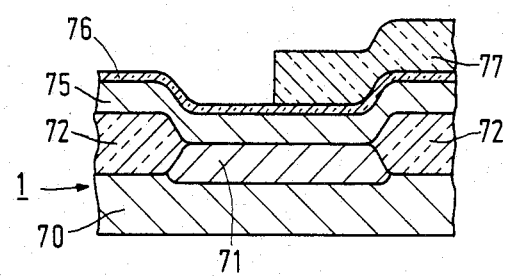
FIGS. 30 to 35 show diagrammatically and in cross-sectional view a semiconductor device at successive stages of the manufacture by means of another variation of the method shown in FIGS. 22 to 27.
Figure 31:
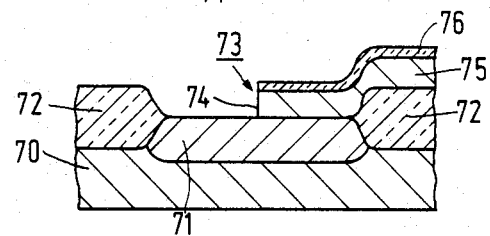
Figure 32:
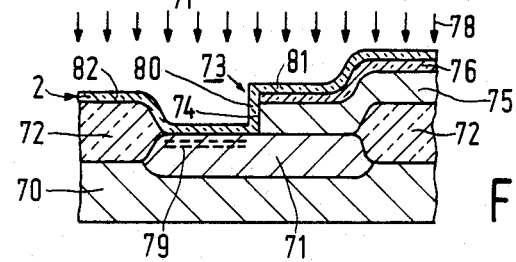
Figure 33:
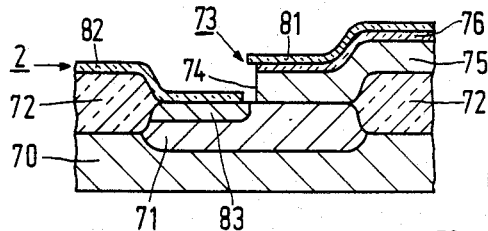
Figure 34:
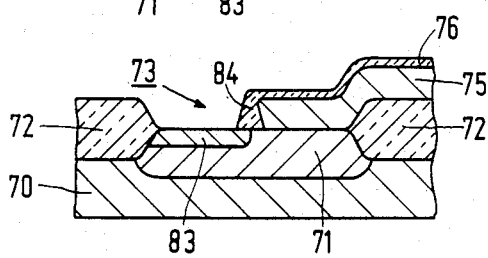

FIGS. 28 and 29 show a transistor which is manufactured in the same manner as shown in FIGS. 22 to 27, but in which a second ion implantation is avoided. After removal of the remaining parts 61 and 63 of the silicon nitride layer 2, such a quantity of silicon oxide is removed by an etching treatment in hydrofluoride that the semiconductor zones 62 are exposed. Now the whole is coated with a layer 68 of, for example, platinum, which forms silicide regions 69 with exposed silicon due to a heat treatment. The platinum layer 68 not reacted with oxide can now be removed.

Figure 27:
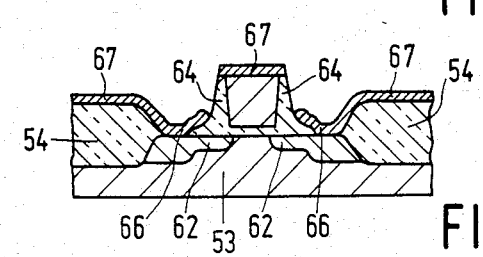

Both the transistor shown in FIG. 27 and that shown in FIG. 29 have good electrical contacts with the semiconductor zones 62, which will act as the source and the drain of the transistor.

FIGS. 30 to 35 show diagrammatically and in cross-sectional view successive stages of the manufacture of another semiconductor device with the use of the second important embodiment of the method according to the invention. In this embodiment, the invention is used to manufacture a bipolar transistor.

The starting material is a substrate 1 which comprises a semiconductor body 70 of silicon of a first conductivity type with a surface part 71 of a second conductivity type surrounded by an approximately 500 nm thick border 72 of field oxide. On the surface part 71 is formed a stepped raised portion 73 with an edge 74 by providing the surface part 71 and the border 72 with a layer 75 of polycrystalline silicon on which a layer of silicon oxide 76 is disposed. On this layer is formed a pattern 77 of photolacquer, after which the stepped raised portion 73 with the edge 74 is etched by means of usual anisotropic plasma etching methods. The silicon nitride layer 2 is provided over the stepped raised portion 73. Subsequently, an ion implantation is carried out with a beam of ions indicated by arrows 78 and determining a first conductivity type, which beam is directed substantially parallel to the edge 74 of the stepped raised portion 73. By this implantation 78, ions 79 are implanted into the surface part 71 and into the silicon nitride layer 2. A part 80 of the layer 2 is then screened by the part 81 which is disposed on top of the stepped raised portion 73. After the heat treatment in accordance with the invention, a semiconductor zone 83 of the first conductivity type has been formed by diffusion of the ions 79 and the part 80 of the silicon nitride layer 2 can be removed, whereas the parts 81 and 82 are maintained. Thus, there is formed in the silicon nitride layer 2 a pattern which leaves free only the edge 74 of the stepped raised portion 73. This pattern is then used as a mask in the following oxidation treatment, in which the edge 74 of the stepped raised portion 73 is converted into insulating silicon oxide 84. After a conductor 85 contacting the semiconductor zone 83 and a conductor 86 contacting the semiconductor body 70 have been provided, the envisaged bipolar transistor is complete. By the method used, in which the implantation 79 for the semiconductor zone 83 and the mask 81, 82 for the provision of the insulation 84 are realized in a self-registered manner, it is ensured that the pn junction 71, 83 is not short-circuited by the conductor 75 or the conductor 85.

Figure 35:
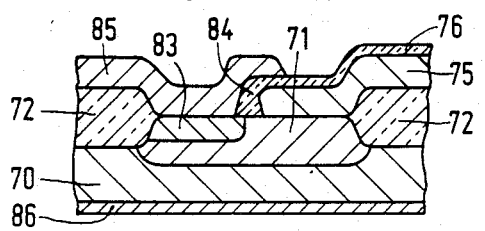
Figure 36:
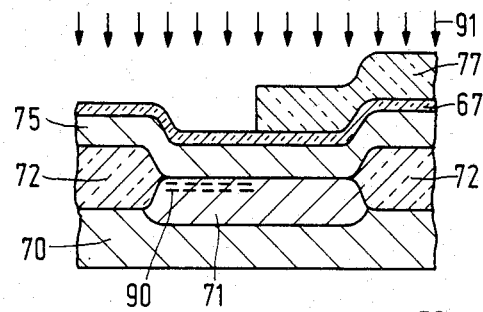
FIGS. 36 to 41 show diagrammatically and in cross-sectional view a semiconductor device at successive stages of the manufacture by means of another preferred embodiment of the second method according to the invention.
Figure 37:
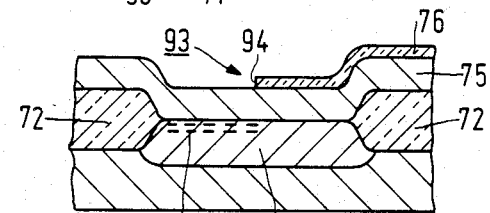
Figure 38:
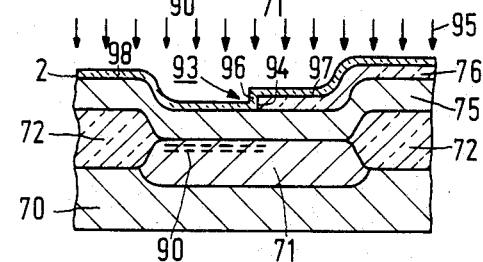
Figure 39:
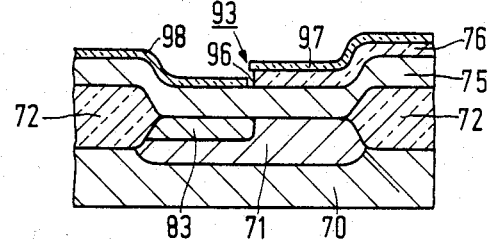
Figure 40:
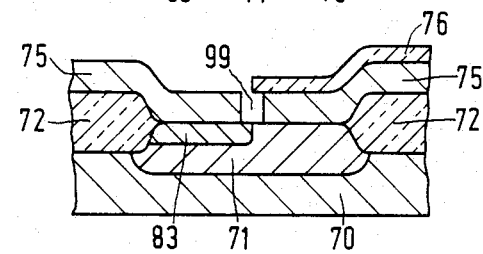

FIGS. 36 to 41 show diagrammatically and in cross-sectional view successive stages of the manufacture of a bipolar transistor similar to that shown in FIG. 35 with the use of another preferred form of the second important embodiment of the method according to the invention.

Figure 41:
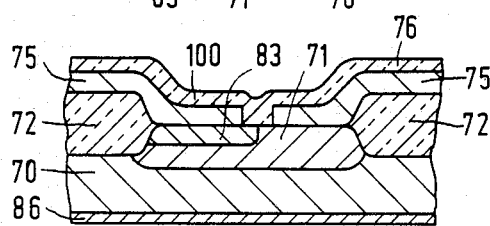
Figure 42:
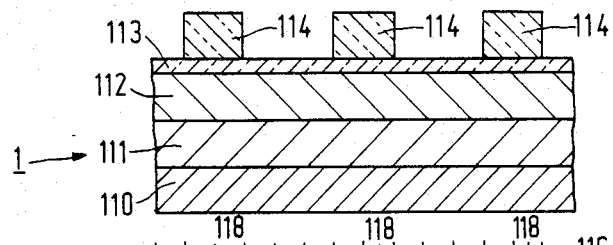
FIGS. 42 to 47 show diagrammatically and in cross-sectional view a semiconductor device at successive stages of the manufacture by a further preferred embodiment of the second method according to the invention.
Figure 43:
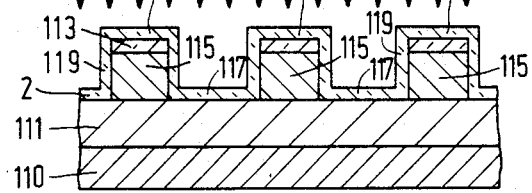
Figure 44:
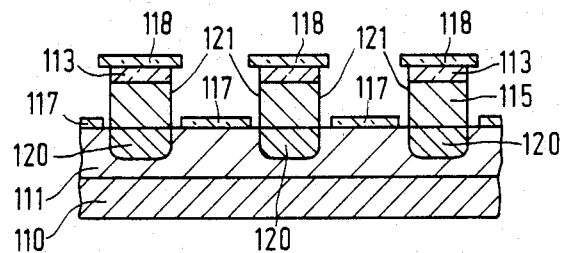
Figure 45:
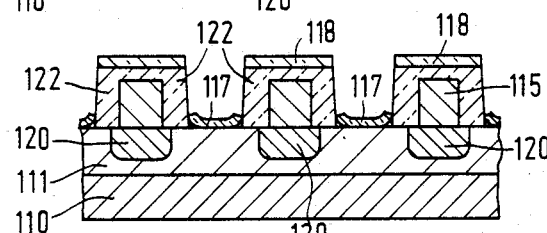
Figure 46:
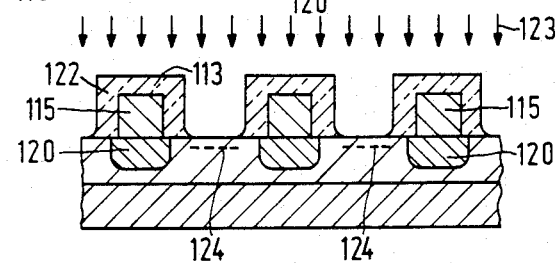
Figure 47:
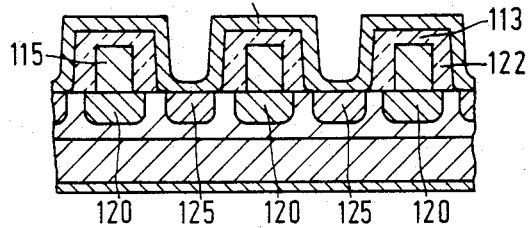

The starting material is a similar semiconductor body 70 having a surface part 71 insulated by a border 72 of field oxide, while the whole is coated with a layer 75 of polycrystalline silicon and a layer 76 of silicon oxide. The pattern of photolacquer 77 is used in this case first as a mask during the implantation of ions 90 characteristic of the second conductivity type into the surface part 71 by means of an ion beam indicated diagrammatically by arrows 91. Subsequently, the pattern 77 is used to etch a stepped raised portion 93 with a straight edge 94 into the silicon oxide layer 76 by means of a usual anisotropic plasma etching method. This stepped raised portion is coated with the silicon nitride layer 2. Then ions are implanted into the silicon nitride layer 2 with the aid of a beam of ions indicated by arrows 95 and directed substantially parallel the edge 94. Also in this case, a part 96 of the layer 2 is screened by a part 97 of the layer 2 disposed on top of the stepped raised portion 93. After the thermal treatment in accordance with the invention, the semiconductor zone 83 has been formed and the part 96 of the layer 2 can be removed, whereas the parts 97 and 98 are maintained. The remaining part 98 of the layer 2 and the exposed edge 96 of the stepped raised portion 93 are now used as a mask during the etching of an opening 99 into the layer 75 of polycrystalline silicon. After thermal oxidation of the layer 75, and connected to the insulating layer 76 the insulating layer 100 is also formed and two mutually insulated conductors are manufactured from the layer 75. After the conductor 86 has been provided, the transistor of FIG. 41 is complete. The transistor thus formed has, compared with the transistor of FIG. 35, a planar structure which can be obtained at the expense of an additional ion implantation.

FIGS. 42 to 47 show diagrammatically and in cross-sectional view a semiconductor device at successive stages of manufacture according to a further form of the second important embodiment of the method in accordance with the invention. In this embodiment, the invention is used to manufacture a static induction transistor.

The starting material is a substrate 1 which comprises a semiconductor body 110 of silicon of a first conductivity type with a surface layer 111 of the same first conductivity type. The surface layer 111 is coated with an approximately 500 nm thick layer 112 of polycrystalline silicon, which is then provided by means of thermal oxidation with an approximately 100 nm thick top layer of silicon oxide 113. Boron ions are then implanted into the layer 112 of polycrystalline silicon. Subsequently, stepped raised portions 115 are formed in the layer 112 of polycrystalline silicon by means of a photolacquer mask 114 and a usual anisotropic plasma etching technique, which stepped raised portions 115 are then coated with an approximately 100 nm thick silicon nitride layer 2. Subsequently, an ion implantation is carried out with the aid of a beam of ions which are indicated by arrows 116 and are implanted into the parts 117 and 118 of the silicon nitride layer 2; the parts 119 of the layer 2 are then screened by the parts 118. After the thermal treatment according to the invention, the p-type conducting zones 120 are formed by diffusion of boron from the layer 112 and the parts 119 of the silicon nitride layer 2 can be removed. The edges 121 of the stepped raised portions 115 thus exposed are then provided by means of thermal oxidation with silicon oxide layers 122. After removal of the remaining parts 117 and 118 of the silicon nitride layer 2, arsenic ions 124 are implanted with the aid of a beam indicated by arrows 123 into the surface layer 111. Finally, the n-type conducting zones 125 are formed by means of the heat treatment and the metallizations 126 and 127 are provided.

What is claimed is:

1. A method of manufacturing a semiconductor device comprising the steps of
implanting ions into portions of a layer of silicon nitride,
then heat treating said layer of silicon nitride at a temperature above 750° C. to form a higher resistance to etching at the implanted portions of said layer than at non-implanted portions of said layer, and
thereafter etching said layer to remove said non-implanted portions of said layer.

2. A method according to claim 1, wherein said ions are formed from an element chosen from the group comprising nitrogen, antimony, boron, gallium, phosphorous, arsenic, argon, krypton, and xenon.

3. A method according to claim 1, wherein said ions are implanted at such an energy to penetrate at least halfway into said layer of silicon nitride.

4. A method according to claim 1, wherein said step of heat treating is carried out for 15 to 120 minutes at a temperature ranging from 750° C. to 1100° C.

5. A method according to claim 1, wherein said layer of silicon nitride is deposited at a temperature of 750° C. to 850° C. and at a reduced pressure from a gas mixture comprising dichlorosilane and ammonia.

6. A method according to one of claims 1, 2, 3, 4, or 5, wherein a stepped raised portion having at least one straight raised edge is formed on said silicon nitride layer, said straight edge at least being temporarily provided with an auxiliary layer, and wherein said step of implanting ions is carried out by directing an ion beam substantially parallel to said edge.

7. A method according to claim 6, wherein said stepped raised portion and said auxiliary layer are formed as a mask during another ion implantation into a substrate below said silicon nitride layer, said auxiliary layer then being removed for said step of implanting ions into said silicon nitride layer.

8. A method according to claim 7, wherein a layer of silicon oxide is provided between said silicon nitride layer and said substrate, and wherein after said step of etching to remove non-implanted portions of said silicon nitride layer, remaining portions of said silicon nitride layer are used as a mask for etching said layer of silicon oxide.

9. A method according to claim 6, wherein said stepped raised portion and said auxiliary layer are used as a mask for said step of implanting ions into said silicon nitride layer, and wherein said stepped raised portion without said auxiliary layer is used as another mask during said step of etching said silicon nitride layer.

10. A method according to claim 9, wherein a layer of polycrystalline silicon is provided below said silicon nitride layer, and after said step of etching, said implanted portions of said silicon nitride layer are used as a further mask for etching gaps into said polycrystalline silicon layer, said gaps then being filled by an oxidation treatment with silicon oxide.

11. A method according to one of claims 1, 2, 3, 4, or 5, wherein said silicon nitride layer is provided over a stepped raised portion having at least one straight raised edge, and wherein said step of implanting ions is carried out by directing an ion beam substantially parallel to said edge.

12. A method according to claim 11, wherein after said step of etching, remaining portions of said silicon nitride layer are used as a mask during an oxidation treatment of said exposed straight raised edge of said stepped raised portion.

13. A method according to claim 12, wherein during said step of implanting ions into portions of said silicon nitride layer, ions are simultaneously implanted into a substrate below said silicon nitride layer, said ions implanted into said substrate forming at least one semiconductor zone in said substrate by diffusion during said step of heat treating.

14. A method according to claim 13, wherein said oxidation treatment includes thermal oxidation of said exposed edge.

15. A method according to claim 14, wherein said stepped raised portion with the oxidized edge is used as another mask during said forming of said semiconductor zone, said semiconductor zone being locally doped more strongly.

16. A method according to claim 14, wherein the oxidized edge of said stepped raised portion is used as a mask during silicide formation with the entire surface being successively subjected to an etching treatment, said etching treatment leaving an upper side of said stepped raised portion and substrate portions exposed, and wherein said entire surface is coated with a metal and is subjected to another heat treatment to form said silicide with said metal at exposed parts of said stepped raised portions and said substrate.

17. A method according to claim 12, wherein ions leading to a first conductivity type in a substrate below said stepped raised portion are provided in said stepped raised portion, wherein said exposed edge is thermally oxidized, and wherein said stepped raised portion with the oxidized edge is used as a mask during another ion implantation into said substrate.

* * * * *